(12) United States Patent
Wenwu et al.

(10) Patent No.: US 8,624,325 B2
(45) Date of Patent: Jan. 7, 2014

(54) SEMICONDUCTOR DEVICE AND METHOD OF MANUFACTURING THE SAME

(75) Inventors: Wang Wenwu, Beijing (CN); Shijie Chen, Beijing (CN); Xiaolei Wang, Beijing (CN); Kai Han, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/059,092

(22) PCT Filed: Jun. 23, 2010

(86) PCT No.: PCT/CN2010/074300
§ 371 (c)(1),
(2), (4) Date: Feb. 15, 2011

(87) PCT Pub. No.: WO2011/057492
PCT Pub. Date: May 19, 2011

(65) Prior Publication Data
US 2012/0012939 A1    Jan. 19, 2012

(30) Foreign Application Priority Data
Nov. 11, 2009   (CN) .......................... 2009 1 0237546

(51) Int. Cl.
*H01L 21/70* (2006.01)
(52) U.S. Cl.
USPC .................................. 257/369; 257/E27.062
(58) Field of Classification Search
USPC ............. 257/369, E21.626, E21.64; 438/267, 438/303, 366, 595
See application file for complete search history.

(56) References Cited

U.S. PATENT DOCUMENTS

| | | | |
|---|---|---|---|
| 2008/0256227 A1* | 10/2008 | Malin ........................... | 709/223 |
| 2008/0258227 A1* | 10/2008 | Wang et al. ................... | 257/369 |
| 2008/0308872 A1* | 12/2008 | Bu et al. ........................ | 257/369 |
| 2010/0207214 A1* | 8/2010 | Chuang et al. ................ | 257/369 |
| 2010/0308418 A1* | 12/2010 | Stahrenberg et al. ......... | 257/392 |
| 2011/0042728 A1* | 2/2011 | Cheng et al. .................. | 257/288 |

FOREIGN PATENT DOCUMENTS

| | | |
|---|---|---|
| CN | 1378269 A | 11/2002 |
| CN | 101276787 A | 10/2008 |
| CN | 101325203 A | 12/2008 |

OTHER PUBLICATIONS

International Search Report based on PCT/CN2010/074300.

* cited by examiner

*Primary Examiner* — William D Coleman
*Assistant Examiner* — Christine Enad
(74) *Attorney, Agent, or Firm* — Troutman Sanders LLP

(57) ABSTRACT

The present invention provides a semiconductor device, comprising: a semiconductor substrate having a first region and a second region; a first gate structure belong to a PMOS device on the first region; a second gate structure belong to an nMOS device on the second region; a multiple-layer first sidewall spacer on sidewalls of the first gate structure, wherein a layer of the multiple-layer first sidewall spacer adjacent to the first gat structure is an oxide layer; a multiple-layer second sidewall spacer on sidewalls of the second gate structure, wherein a layer of the multiple layers of second sidewall spacer adjacent to the first gat structure is a nitride layer. Application of the present invention may alleviate the oxygen vacancy in a high-k gate dielectric in a pMOS device, and further avoid the problem of EOT growth of an nMOS device during the high-temperature thermal treatment process, and therefore effectively improve the overall performance of the high-k gate dielectric CMOS device.

6 Claims, 7 Drawing Sheets

SEMICONDUCTOR DEVICE AND METHOD OF MANUFACTURING THE SAME

BENEFIT CLAIMS

This application is a US National Stage of International Application No. PCT/CN2010/074300, filed Jun. 23, 2010, which claims the benefit of CN 200910237546.8, filed Nov. 11, 2009.

FIELD OF THE INVENTION

The present invention relates to a semiconductor device and a method of manufacturing the same, and more specifically, relates to a device with a sidewall spacer structure which advantageously leads to higher performance of a high-k gate dielectric CMOS device.

BACKGROUND OF THE INVENTION

With the development of the semiconductor technology, integrated circuits with higher performance and more powerful functions require greater element density. Thus, the sizes of the components need to be scaled further. The utilization of the core technology for 32/22 nanometer process of integrated circuits has been the inevitable trend for the development of integrated circuits, which are also the projects for major international semiconductor companies and institutions to compete to develop. Study on CMOS device gate engineering with "high-k/metal gate" as the core technology is the most representative in 32/22 nanometer technology, and relevant studies on materials, processes and structures are conducted extensively.

For an MOS device having a high k/metal gate structure, the quality of high-k gate dielectric film, especially the oxygen vacancies and defect density of the high-k gate dielectric film, is essential for the continuous improvement of the performance of the whole device. Currently, hafnium (HO-base high-k gate dielectric film has become the most promising candidate for industrial materials, and has been successfully applied to the 45 nm and 32 nm processes of Intel Corporation. However, there exists serious problems caused by oxygen vacancies in the Hf-base high-k gate dielectric film, for example, degradation of the threshold voltage, mobility of channel carriers, and reliability, etc. It also has negative influence on the threshold voltage of a device, for example, Fermi level pinning effect, and flat band voltage roll-off ($V_{fb}$ roll-off) in a PMOS device, etc. Therefore, it has become a challenge in production of an MOS device, particularly a PMOS device, to alleviate the density of oxygen vacancy defects in the high-k gate dielectric film.

In the current method of manufacturing a high-k gate dielectric/metal gate structured MOS device, the high-k film layer grown by a chemical method (for example, an Atomic Layer Deposition (ALD) or Metal Organic Chemical Vapor Deposition (MOCVD)) generally has more defects and charge traps, and insufficient compactness in the high-k gate dielectric film. In order to increase the compactness of the high-k gate dielectric film and meanwhile alleviate oxygen vacancy and defect traps, a post-deposition-annealing (PDA) process may be conducted at a temperature in the range of about 400-1100° C. However, in this process, oxygen in the annealing atmosphere will enter into the MOS device having a high-k gate dielectric/metal gate structure due to diffusion at a high temperature, and pass through the dielectric layer, and finally arrive at the $SiO_2$/Si interface to react with the silicon substrate and generate $SiO_2$, and thereby the thickness of $SiO_2$ interface layer will be decreased. This will disadvantageously lead to increase of Equivalent Oxide Thickness (EOT) of the whole gate structure, and finally lead to degradation of the overall performance for the MOS device. Furthermore, during the MOS device manufacturing process, annealing is required at a temperature in the range of about 950-1100° C. to activate the dopants in source/drain regions. During this thermal treatment process, oxygen in the high-k gate dielectric film will be diffused into the $SiO_2$/Si interface, and lead to oxygen vacancy defects in the high-k gate dielectric film. Utilization of the high-k gate dielectric and the metal gate electrode in a PMOS device may have some disadvantages. For example, these defects may seriously affect the threshold voltage of the device, in particular the threshold voltage feature of the PMOS device. Therefore, it has become a challenge in production of nanometer CMOS devices to alleviate the increase of the threshold voltage caused by oxygen vacancy.

Therefore, in order to improve the performance of a CMOS device having a high-k gate dielectric/metal gate structure, there is a need for a semiconductor device and a method of manufacturing the same.

SUMMARY OF THE INVENTION

In view of the above problems, the present invention proposes a semiconductor device. The device comprises: a semiconductor substrate having a first region and a second region; a first gate structure belonging to a PMOS device on the first region; a second gate structure belonging to nMOS device on the second region; a multiple-layer first sidewall spacer on sidewalls of the first gate structure, wherein a layer of the multiple-layer first sidewall spacer adjacent to the first gate structure is an oxide layer; and a multiple-layer second sidewall spacer on sidewalls of the second gate structure, wherein a layer of the multiple-layer second sidewall spacer adjacent to the first gat structure is a nitride layer.

In accordance with another aspect of the present invention, a manufacturing method of a semiconductor device is further provided, comprising: providing a semiconductor substrate having a first region and a second region; forming a first gate structure belonging to a PMOS device on the first region; forming a second gate structure belonging to an nMOS device on the second region; forming a multiple-layer first sidewall spacer on sidewalls of the first gate structure, wherein a layer of the multiple-layer first sidewall spacer adjacent to the first gat structure is an oxide layer; forming a multiple-layer second sidewall spacer on sidewalls of the second gate structure, wherein a layer of the multiple-layer second sidewall spacer adjacent to the first gat structure is a nitride layer.

The present invention can well alleviate the oxygen vacancy in a high-k gate dielectric in a pMOS device, and avoid the growth of EOT of an nMOS device during the high-temperature thermal treatment, and therefore the present invention may effectively improve the overall performance of the high-k gate dielectric CMOS device.

DETAILED DESCRIPTION OF THE PREFERRED EMBODIMENTS

The present invention generally relates to a semiconductor device and a method of manufacturing the same, and more particularly, to a semiconductor device with sidewall spacer structure which may improve the performance of a high-k gate dielectric CMOS device. The following disclosure provides a plurality of different embodiments or examples to achieve different structures of the present invention. To simplify the disclosure of the present invention, description of the components and arrangements of specific examples is given below. Of course, they are only illustrative and not limiting the present invention. Moreover, in the present invention, reference numbers and/or letters may be repeated in different embodiments. Such repetition is for the purposes of simplification and clearness, and does not denote the relationship between respective embodiments and/or arrangements being discussed. In addition, the present invention provides various examples for specific process and materials. However, it is obvious for a person of ordinary skill in the art that other process and/or materials may alternatively be utilized. Furthermore, the following structure in which a first object is "on" a second object may comprise an embodiment in which the first object and the second object are formed to be in direct contact with each other, and may also comprise an embodiment in which another object is formed between the first object and the second object such that the first and second objects might not be in direct contact with each other.

Figure 1:
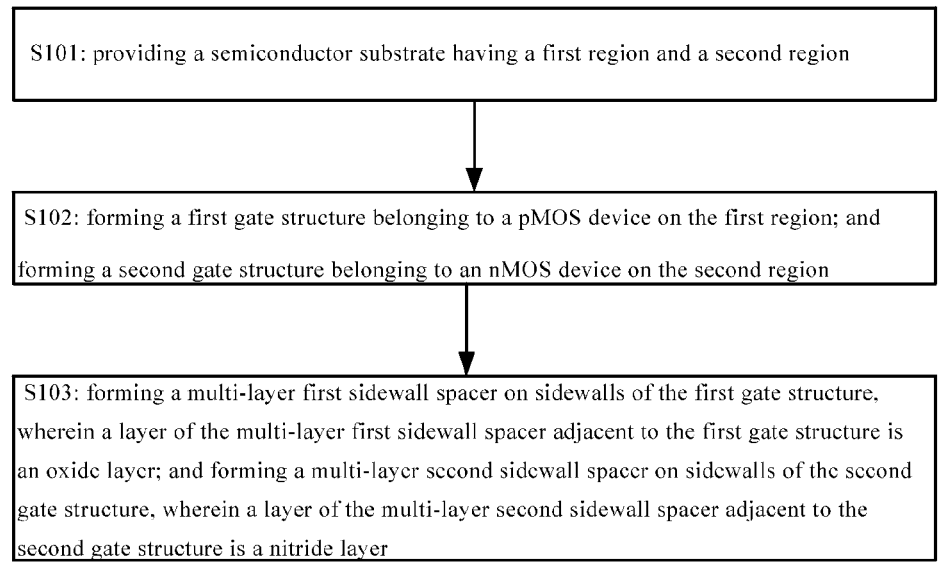
FIG. 1 is a flowchart illustrating a method of manufacturing a semiconductor device according to an embodiment of the present invention.

With reference to FIG. 1, FIG. 1 is a flowchart illustrating a method of manufacturing a semiconductor device according to an embodiment of the present invention. The method 100 may be included in a formation process of an integrated circuit or a part thereof, which may comprise a static random access memory (SRAM) and/or other logic circuits, passive elements, such as resistors, capacitors, and inductors, and active elements, for example P-channel field effect transistors (PFETs), N-channel field effect transistors (NFETs), metal oxide semiconductor field effect transistors (MOSFETs), complementary metal oxide semiconductor (CMOS) transistors, bipolar transistors, high voltage transistors, and high frequency transistors, and other memory units, or any combination thereof, and/or other semiconductor devices.

Figure 2:
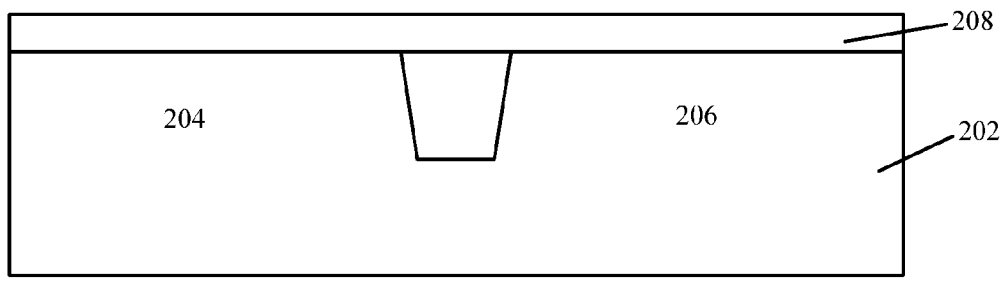
FIGS. 2-14 are structural diagrams illustrating the semiconductor devices according to various aspects of the present invention.

In step 101, firstly, a semiconductor substrate 202 (for example, a wafer) is provided, wherein the semiconductor substrate 202 has a first area 204 and a second area 206, as shown in FIG. 2. In this embodiment, the substrate 202 comprises a silicon substrate in crystalline structure. According to the design specifications known in the prior art, the substrate may be of various doping configurations (for example, a p-type substrate or an n-type substrate). Other example of the substrate may also comprise other semiconductor, for example, geranium and diamond. Alternatively, the substrate may comprise compound semiconductors, such as SiC, GaAs, InAs, InP, or graphene. Further, in order to improve performance, the substrate may comprise an epitaxial layer (epi layer) and/or silicon on insulator (SOI) structure. Still further, the substrate may comprise a plurality of features formed thereon, such as an active region, source and drain regions in the active region, an isolation region (for example, a shallow trench isolation (STI) feature), and/or other features known in the art. With reference to FIG. 2, a semiconductor substrate 202 is provided, wherein the semiconductor substrate 202 has a first area 204 and a second area 206.

Then, a first gate structure belonging to a pMOS device is formed on the first region at step 102, and a second gate structure belonging to an nMOS device is formed on the second region. For example, the first and second gate structures may be formed by the following method. An interface layer 208 is formed on the substrate 202, as shown in FIG. 2. The interface layer 208 may be directly formed on the substrate 202. In this embodiment, the interface layer 208 may be $SiO_2$, SiON or $Si_3N_4$. The thickness of the interface layer 208 is in the range of about 0.2-1 nm, preferably in the range of about 0.2-0.8 nm, and most preferably in the range of about 0.2-0.7 nm. The interface layer may also be formed of other materials, for example, silicon nitride or silicon oxynitride materials. The interface layer 208 may be formed by Atomic Layer Deposition (ALD), Chemical Vapor Deposition (CVD), High Density Plasma CVD (HDP CVD), sputtering or other suitable methods. The above-mentioned descriptions are only illustrative, and are not intended to limit the present invention.

Figure 3:
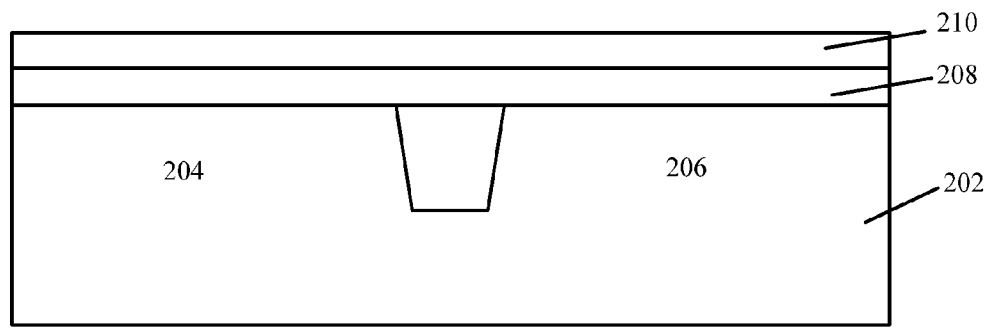

A gate dielectric layer 210 is formed on the interface layer 208, as shown in FIG. 3. The gate dielectric layer 210 may comprise high-k materials (for example, materials with higher dielectric constant than silicon oxide). Examples of high-k dielectric materials may comprise Hf-base materials, for example, $HfO_2$, $HfSiO_x$, HfON, HfSiON, or $HfAlO_x$, or any combination thereof, and/or other suitable materials, for example, $Al_2O_3$, $ZrO_2$, $ZrSiO_x$, $Ta_2O_5$, $La_2O_3$, $HfLaO_x$, $LaAlO_x$, $LaSiO_x$, and nitride of above-mentioned materials, oxynitride of above-mentioned materials, other rare earth oxide, and other rare earth nitride. The gate dielectric layer 210 may have a multilayer structure, including those layers used in forming an nMOS transistor gate structure and/or a pMOS transistor gate structure. The gate dielectric layer may be formed by thermal oxidation, CVD, and ALD In this embodiment, the thickness of the gate dielectric layer 210 is in the range of about 2-10 nm, preferably in the range of about 2-5 nm, and most preferably in the range of about about 2-3 nm. The above-mentioned descriptions are only illustrative, and are not intended to limit the present invention.

Figure 4:
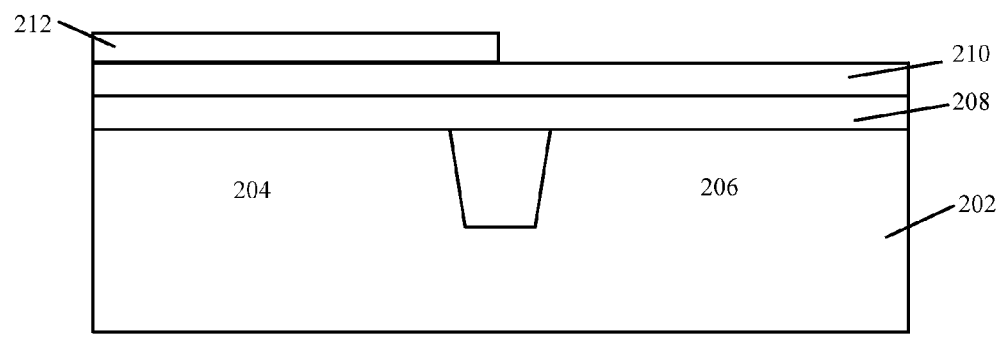
Figure 5:
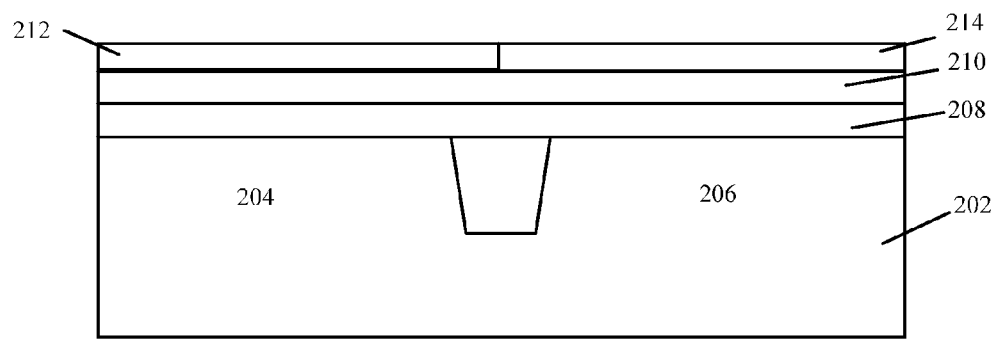

Next, with reference to FIGS. 4 and 5, a work function metal gate layer 212 for adjusting the work function is formed in the first region, and a work function metal gate layer 214 for adjusting the work function is formed in the second region. As shown in FIG. 4, after forming the gate dielectric layer 210, the work function metal gate layer 212 belonging to the first region may be deposited thereon. The work function metal gate layer 212 may have a thickness in a range from about 2 nm to 100 nm, preferably in a range from about 5-70 nm, and most preferably in a range from about 10-50 nm. Materials for the first work function metal gate layer may comprise $TaC_x$, TiN, TaN, $MoN_x$, TiSiN, TiCN, TaAlC, TiAlN, $PtSi_x$, $Ni_3Si$, Pt, Ru, Ir, Mo, HfRu, $RuO_x$, polysilicon, and metal silicide, and any combination thereof. As shown in FIG. 5, the work function metal gate layer 214 belonging to the second region may be deposited on the gate dielectric layer 210. This work function metal gate layer 214 may have a thickness in the range of about 2 nm-100 nm, preferably in the range of about 5-70 nm, and most preferably in the range of about 10-50 nm. The materials used for the second work function metal gate layer may comprise TaC, HfC, TiC, TiN, TaN, TaTbN, TaErN, TaYbN, TaSiN, HfSiN, MoSiN, $RuTa_x$, $NiTa_x$, polysilicon, and metal silicide, and any combination thereof. The above-mentioned descriptions are only illustrative, and are not intended to limit the present invention.

Figure 6:
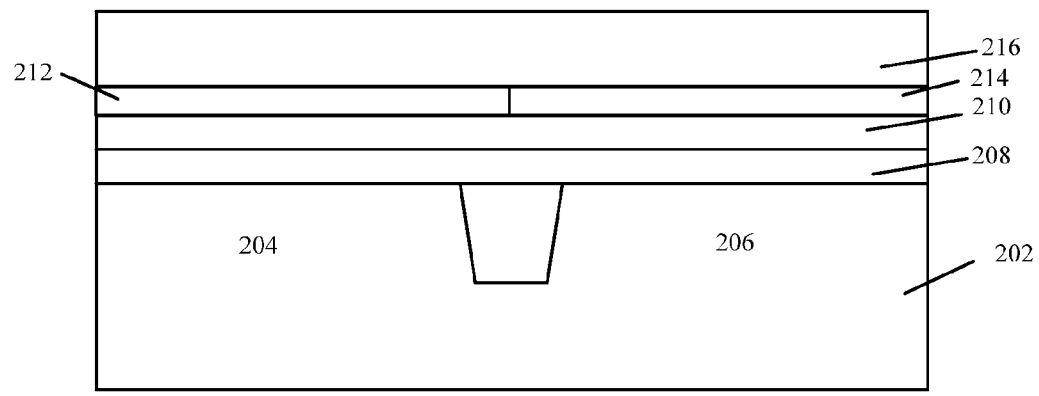

Then, a polysilicon layer 216 is deposited on the work function metal gate layers, as shown in FIG. 6. The polysilicon layer may have a thickness in the range of about 10-200 nm, preferably in the range of about 30-100 nm, and most preferably in the range of about 50-70 nm. The above-mentioned descriptions are only illustrative, and are not intended to limit the present invention.

Figure 7:
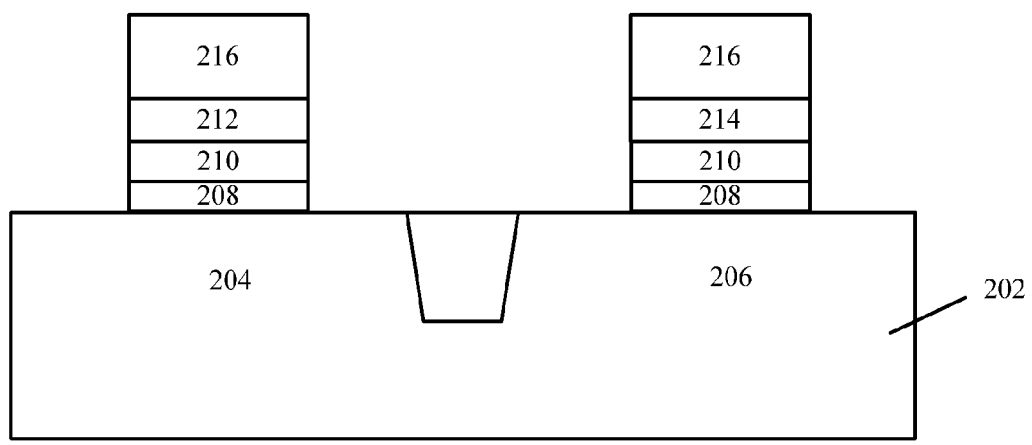

After depositing the polysilicon layer, the first region and the second region are patterned to form a first gate structure and a second gate structure, as shown in FIG. 7. Dry etching or wet etching technique may be used to pattern the first region and second region. The above descriptions are only exemplary, and the present invention is not limited thereto.

In step 103, a multiple-layer first sidewall spacer is formed at sidewalls of the first gate structure, and a multiple-layer second sidewall spacer is formed at sidewalls of the second gate structure, wherein the layer of the multi-layer first sidewall spacer adjacent to the first gate structure is an oxide layer, and the layer of the multi-layer second sidewall spacer adjacent to the second gate structure is a nitride layer.

Figure 8:
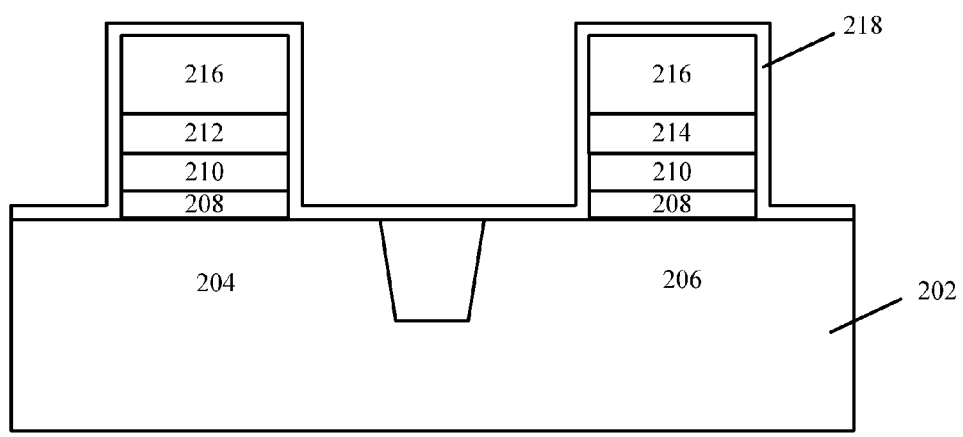

For example, the multi-layer first sidewall spacer and the multi-layer second sidewall spacer are formed by the following method. An oxide layer 218 is deposited on the first region and second region. For example, the oxide layer 218 may be deposited on the first and second regions by methods such as ALD, Plasma Enhanced Chemical Vapor Deposition (PECVD), etc., as shown in FIG. 8, wherein the oxide layer 218 may have a thickness in the range of about 1-10 nm, preferably in the range of about 2-5 nm, and most preferably in the range of about 2-3 nm. And the oxide layer 218 may be, for example, $SiO_2$, or other oxygen-contained suitable oxide, for example, $SiON_x$, $HfO_2$, $Al_2O_3$, $Y_2O_3$, etc.

Figure 9:
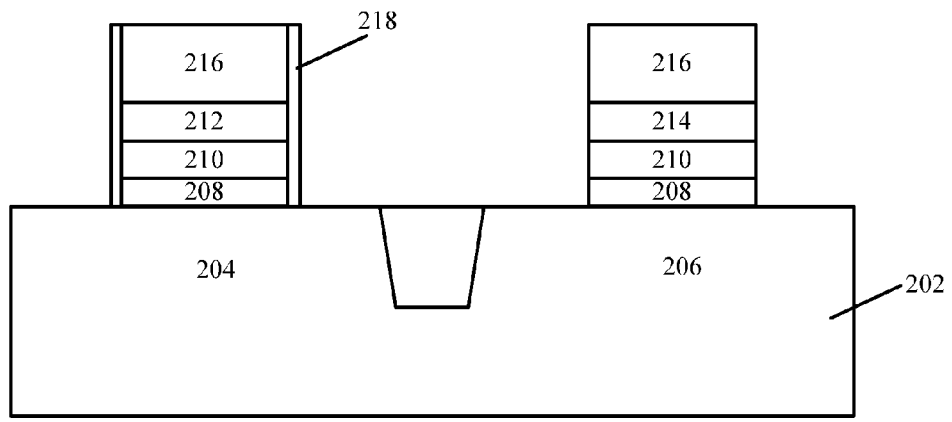

The oxide layer 218 is patterned and etched to form a first sidewall spacer 218 in the first region adjacent to the first gate structure, as shown in FIG. 9. Dry etching or wet etching technology may be used to pattern the oxide layer. The above-mentioned descriptions are only illustrative, and are not intended to limit the present invention.

Figure 10:
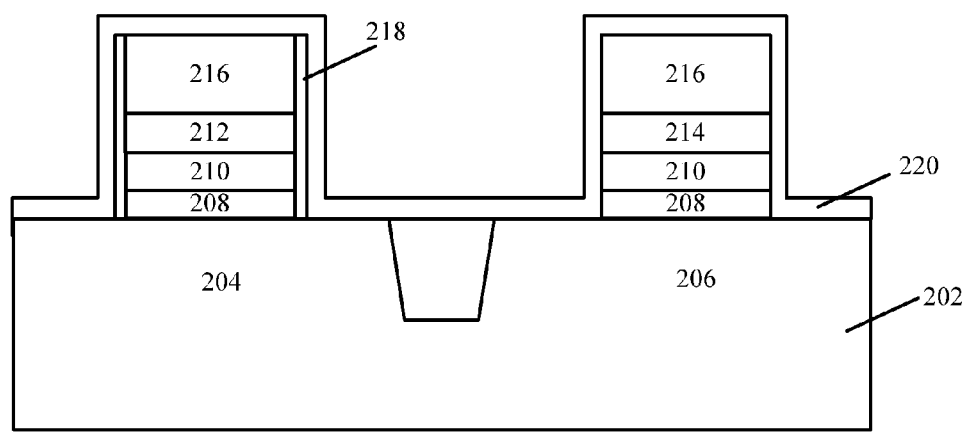

Next, with reference to FIG. 10, a nitride layer 220 is deposited on the first region and second region. For example, the nitride layer 220 may be deposited on the first and second regions by methods such as ALD, PECVD, etc. The nitride layer 220 may have a thickness in the range of about 5-30 nm, preferably in the range of about 10-20 nm, and most preferably in the range of about 10-15 nm. And the nitride layer 220 may be, for example, Si3N4 or other suitable materials, for example, $AlN_x$, $Hf_3N_4$, $Ta_3N_5$, etc.

Figure 11:
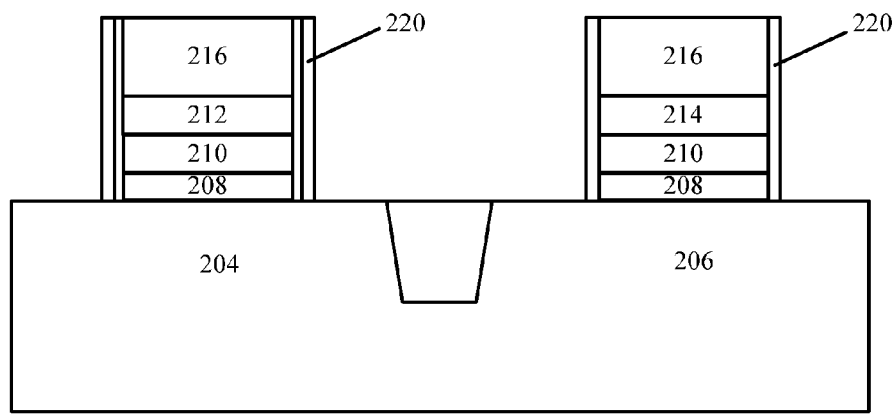

The nitride layer 220 is patterned and etched so as to form a second sidewall spacer 220 adjacent to the second gate structure in the second region, and to form a second sidewall spacer 220 adjacent to the first sidewall spacer 218 in the first region, as shown in FIG. 11. Dry etching or wet etching technology may be used to pattern the oxide layer. The above description is only exemplary, and the present invention is not limited thereto.

Figure 12:
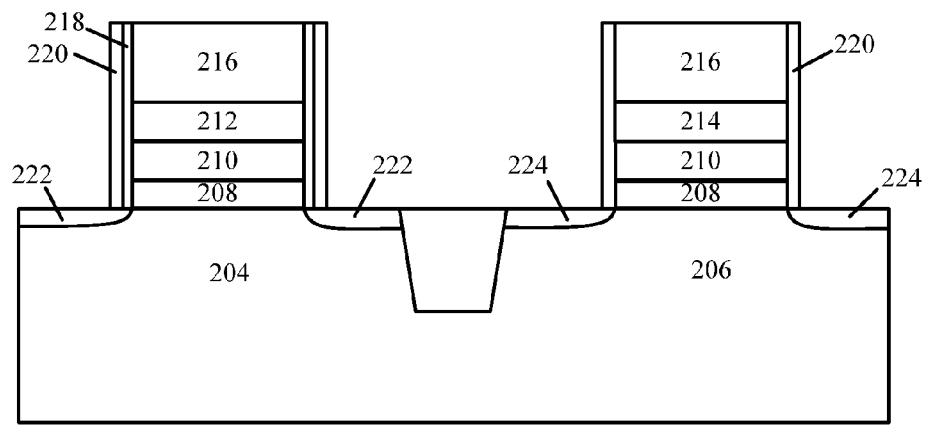

Alternatively, dopant implantation may be performed to the first and second regions after forming the nitride layer, in order to form a first source/drain extension region 222 and a second source/drain extension region 224, as shown in FIG. 12. Alternatively, the implanted dopants may comprise B, BF2, As, P, and other ions suitable for NMOS and pMOS devices. However, it should be noted that the above steps may be implemented optionally, or may be implemented as appropriate.

Figure 13:
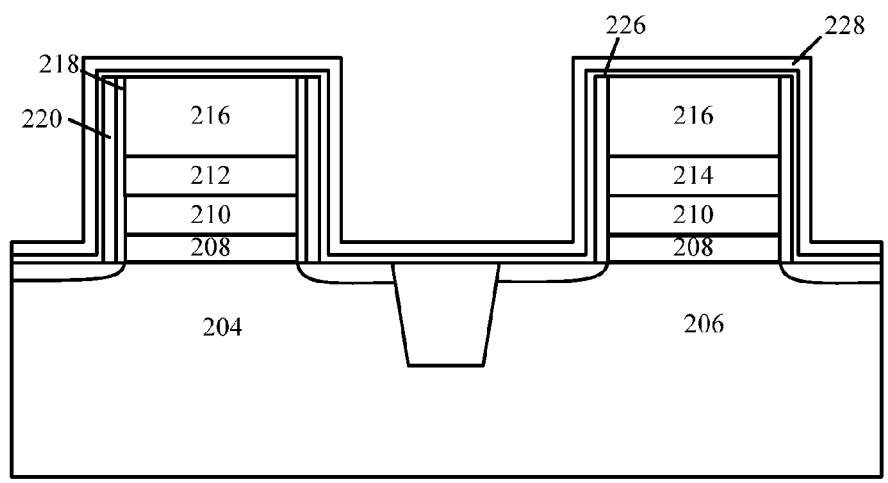

Next, with reference to FIG. 13, an oxide layer 226 is deposited on the first region and the second region. For example, an oxide layer 226 may be deposited on the first and second regions by methods such as ALD, PECVD, etc. The materials for the oxide layer 226 may comprise $SiO_2$ or other suitable material, for example $SiON_x$, $HfO_2$, $Al_2O_3$, $Y_2O_3$, etc. And the oxide layer 226 may have a thickness in the range of about 1-10 nm, preferably in the range of about 3-7 nm, and most preferably in the range of about 3-5 nm. Furthermore, an nitride layer 228 may be deposited on the oxide layer 226 by methods such as ALD, PECVD, etc. The materials for the nitride layer 228 may comprise $Si_3N_4$ or other suitable materials, such as $AlN_x$, $Hf_3N_4$, etc. And the nitride layer 228 may have a thickness in the range of about 5-50 nm, preferably in the range of about 10-40 nm, and most preferably in the range of about 20-30 nm.

Figure 14:
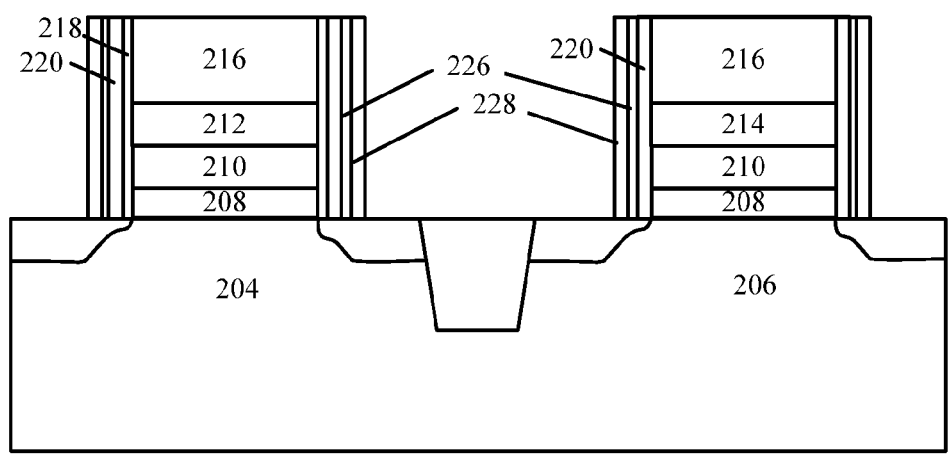

The nitride layer 228 is patterned and etched to form a third sidewall spacer 226 and a fourth sidewall spacer 228 adjacent to the second sidewall spacer 220 of the first gate structure in the first region, wherein the third sidewall spacer may be used as an etching stop layer of the first and second sidewall spacers in the multi-layer sidewall spacers, and the fourth sidewall spacer may provide a nitride sidewall spacer for an embedded GeSi source/drain structure during the subsequent nanometer-level CMOS processing period. Meanwhile, a third sidewall spacer 226 and a fourth sidewall spacer 228 adjacent to the second sidewall spacer 220 of the second gate structure are formed in the second region, wherein the third sidewall spacer may be used as an etching stop layer of the second sidewalls in the multi-layer sidewall spacers, and the fourth sidewall spacer may provide a nitride sidewall spacer for an embedded GeSi source/drain structure in the subsequent nanometer-level CMOS processing period, as shown in FIG. 14. Dry etching or wet etching technology may be used to pattern the oxide layer. The above description is only exemplary, and the present invention is not limited thereto.

Next, the device may be processed, for example, by dopant implantation to form source/drain regions, and by processes such as annealing for activating the dopants.

The above embodiment that a sidewall spacer structure may be used to improve the high-k gate dielectric CMOS device performance is merely a typical example of the present invention. In this embodiment, for the nMOS and pMOS devices, the high-k gate dielectric is made of the same material, and the work function metal gate layers are made of two different materials. However, in other embodiments (not shown), for the nMOS and pMOS devices, high-k gate dielectric of different materials may be used, and the metal gates may use the same material. Meanwhile, for the same or different high-k gate dielectric materials used in the nMOS and pMOS devices, different kinds of cap layer materials may be selectively formed thereon. For example, for an nMOS device, it may be a rare earth oxide, such as $La_2O_3$ and $Y_2O_3$. And for a pMOS device, it may be $Al_2O_3$, etc. These modifications all fall within the scope of the present invention.

According to the present invention, for a pMOS device, the first layer oxide sidewall spacer may provide oxygen atoms for the high-k gate dielectric film to alleviate oxygen vacancy defects in the high-k gate dielectric layer during the annealing process for activating the source/drain dopants, so as to achieve the characteristic of the improved threshold voltage. Additionally, since the oxygen element has a great electronegativity, if the oxygen in the sidewall spacer is partially diffused into the metal gate electrode, the effective work function of the metal electrode will be increased, which may further reduce the threshold voltage of the device. Furthermore, oxygen in the sidewall spacer may be diffused to the $SiO_2$/Si interface and react with the Si substrate to generate $SiO_2$, which disadvantageously leads to increase of the EOT for the device. Thus, for an NMOS device, since the first layer sidewall spacer is nitride, when performing annealing for activating source/drain dopants, the increase of EOT caused by oxygen diffusion in the sidewall spacer is avoided.

By virtue of the present invention, during the CMOS device processing process, sidewall spacers of different structures are introduced in the nMOS device and pMOS device, respectively, to improve the performance of the CMOS device having a high-k gate dielectric/metal gate structure. Application of this process may not only alleviate the oxygen vacancy in the high-k gate dielectric in the pMOS device, but also may avoid the problem of EOT growth of the nMOS device during the high-temperature thermal treatment process, and therefore may effectively improve the overall performance of the high-k gate dielectric CMOS device.

Although the embodiments and their advantages have been described in detail, it is readily apparent to those having ordinary skill in the art that various alterations, substitutions and modifications may be made to the embodiments without departing from the spirit of the present invention and the scope as defined by the appended claims. For other examples, it may be easily recognized by a person of ordinary skill in the art that the order of the process steps may be changed without departing from the scope of the present invention.

In addition, the scope to which the present invention is applied is not limited to the process, mechanism, manufacture, material composition, means, methods and steps described in the specific embodiments in the specification. A person of ordinary skill in the art would readily appreciate from the disclosure of the present invention that the process, mechanism, manufacture, material composition, means, methods and steps currently existing or to be developed in future, which perform substantially the same functions or achieve substantially the same effect as that in the corresponding embodiments described in the present invention, may be applied according to the present invention. Therefore, it is intended that the scope of the appended claims of the present invention comprises these process, mechanism, manufacture, material composition, means, methods or steps.

What is claimed is:

1. A semiconductor device, comprising:
a semiconductor substrate having a first region and a second region;
a first gate structure belonging to a pMOS device on the first region and comprising: a first interface layer, a first gate dielectric layer, and a first work function metal gate layer formed on the first region of the substrate, wherein the gate dielectric layer of the first gate structure comprises a high-k dielectric;
a second gate structure belonging to an nMOS device on the second region and comprising a second interface layer, a second gate dielectric layer, and a second work function metal gate layer formed on the second region of the substrate, wherein the gate dielectric layer of the second gate structure comprises a high-k dielectric;
wherein the thickness of said first and second interface layers is in the range of about 0.2-1 nm;
a multi-layer first sidewall spacer on sidewalls of the first gate structure, wherein a layer of the multi-layer first sidewall spacer adjacent to the first gate structure is formed by at least one element selected from a group consisting of $SiON_x$, $HfO_2$, $Al_2O_3$, $Y_2O_3$, and any combination thereof, and has a thickness in the range of about 2-3 nm; and
a multi-layer second sidewall spacer on sidewalls of the second gate structure, wherein a layer of the multi-layer second sidewall spacer adjacent to the second gate structure is formed by at least one element selected from a group consisting of $AlN_x$, $Hf_3N_4$, $Ta_3N_5$, and any combination thereof, and has a thickness in the range of about 10-15 nm;
wherein every oxide layer within said first and second multi-layer sidewall spacers is I-shaped.

2. The semiconductor device according to claim 1, wherein the multi-layer first sidewall spacer and the multi-layer second sidewall spacer comprise a plurality of oxide layers and nitride layers, respectively.

3. The semiconductor device according to claim 2, wherein the oxide layer is formed by at least one element selected from a group consisting of SiONx, HfO2, Al2O3, Y2O3, and any combination thereof, and wherein the nitride layer is formed by at least one element selected from a group consisting of AlNx, Hf3N4, Ta3N5, and any combination thereof.

4. The semiconductor device according to claim 1, wherein the gate dielectric layer of the first gate structure and the gate dielectric layer of the second gate structure are formed by at least one element selected from a group comprising HfO2, HfSiOx, HfSiON, HfAlOx, Al2O3, ZrO2, ZrSiOx, Ta2O5, La2O3, HfLaOx, LaSiOx, nitride and oxynitride of these elements, rare earth oxide, and rare earth nitride, and any combination thereof.

5. The semiconductor device according to claim 1, wherein the work function metal gate layer of the first gate structure is formed by at least one element selected from a group comprising TaCx, TiN, TaN, MoNx, TiSiN, TiCN, TaAlC, TiAlN, PtSi, Ni3Si, Pt, Ru, Ir, Mo, HfRu, RuOx, and any combination thereof.

6. The semiconductor device according to claim 1, wherein the work function metal gate layer of the second gate structure is formed by at least one element selected from a group comprising TaC, HfC, TiC, TiN, TaN, TaTbN, TaErN, TaYbN, TaSiN, HfSiN, MoSiN, RuTax, NiTax, and any combination thereof.

* * * * *